(12) United States Patent
Hamard et al.

(10) Patent No.: US 10,361,559 B2
(45) Date of Patent: Jul. 23, 2019

(54) DYNAMIC FILTERING DEVICE FOR SENSOR

(71) Applicant: VALEO Schalter und Sensoren GmbH, Bietigheim-Bissingen (DE)

(72) Inventors: Guillaume Hamard, Troy, MI (US); Erick Mok, Troy, MI (US)

(73) Assignee: Valeo Schalter und Sensoren GmbH, Bietigheim-Bissingen (DE)

(*) Notice: Subject to any disclaimer, the term of this patent is extended or adjusted under 35 U.S.C. 154(b) by 127 days.

(21) Appl. No.: 15/796,149

(22) Filed: Oct. 27, 2017

(65) Prior Publication Data

US 2019/0131788 A1  May 2, 2019

(51) Int. Cl.
| H02J 1/02 | (2006.01) |
| B06B 1/02 | (2006.01) |
| H03H 11/04 | (2006.01) |
| G01S 15/93 | (2006.01) |

(52) U.S. Cl.
CPC .............. *H02J 1/02* (2013.01); *B06B 1/0207* (2013.01); *H03H 11/04* (2013.01); *B06B 2201/30* (2013.01); *G01S 15/931* (2013.01); *G01S 2015/938* (2013.01)

(58) Field of Classification Search
CPC ...... H02J 1/02; B06B 1/0207; B06B 2201/30; H03H 11/04; G01S 15/931; G01S 2015/938
See application file for complete search history.

(56) References Cited

FOREIGN PATENT DOCUMENTS

| CN | 106787925 A | 5/2017 |
| DE | 19847014 A1 | 4/2000 |
| DE | 102011003779 A1 | 4/2012 |
| DE | 102012211630 A1 | 1/2014 |
| DE | 102004059994 B4 | 7/2014 |
| DE | 102015109944 A1 | 12/2016 |
| DE | 102016103514 A1 | 8/2017 |
| EP | 0623395 B1 | 1/1997 |
| EP | 1615050 A2 | 1/2006 |
| GB | 2523261 A | 8/2015 |

OTHER PUBLICATIONS

International Search Report and Written Opinion issued in International Application No. PCT/EP2017/051899, dated Apr. 4, 2017 (13 pages).
Search Report issued in German Application No. 10 2016 103 514.9, dated Sep. 21, 2016 (10 pages).

*Primary Examiner* — Robert L Deberadinis
(74) *Attorney, Agent, or Firm* — Osha Liang LLP

(57) ABSTRACT

A filtering device includes a filtering circuit that connects a voltage source to a sensor and a switching circuit connected in parallel with the filtering circuit that allows current from the voltage source to bypass the filtering circuit and flow through the switching circuit. The switching circuit receives a mode signal from the sensor that indicates whether the sensor is in a high current or a low current mode, the switching circuit closes when the sensor is in the high current mode, and the switching circuit is opens when the sensor is in the low current mode.

20 Claims, 9 Drawing Sheets

DYNAMIC FILTERING DEVICE FOR SENSOR

BACKGROUND OF INVENTION

Power supplies for sensors often introduce unwanted and extraneous electrical noise affecting the output signal of a sensor. Consequently, since the output of the sensor contains noise, the sensor readings resulting from that output are similarly distorted due to that same electrical noise. One such error is that a "false detection" can occur, where the sensor produces data appearing to show a detection, but is actually displaying the electrical noise of the power supply.

Thus, filtering devices are often disposed between a sensor and its power supply. These devices are often designed to reduce or remove (i.e., filter) extraneous electrical noise introduced from a power supply and other sources thereby providing a cleaner power input to the sensor and thereby producing a more accurate output. Further, when the output is read into the sensor, the data input is cleaner (removing 'false detections') thereby producing better data.

Ultrasonic sensors can be arranged on a bumper of the motor vehicle and serve to detect objects in the surroundings of the motor vehicle. In order to be able to detect the objects, an ultrasound signal is emitted from the ultrasonic sensor during a transmission phase. For this purpose, a membrane of the ultrasonic sensor is excited with a corresponding transducer element, for example a piezoelectric element, to oscillate. In order to be able to operate the converter element during the transmission phase, comparatively high electrical currents are required. In a subsequent evaluation phase, the ultrasound signal reflected by the object is received again with the ultrasonic sensor. During the evaluation phase, the transducer element is not excited. In this case, the ultrasonic sensor is operated with a relatively low evaluation current or operating current.

SUMMARY OF INVENTION

In general, in one aspect, the invention relates to a filtering device. A filtering device comprises a filtering circuit that connects a voltage source to a sensor; a switching circuit connected in parallel with the filtering circuit that allows current from the voltage source to bypass the filtering circuit and flow through the switching circuit, wherein the switching circuit receives a mode signal from the sensor that indicates whether the sensor is in a high current or a low current mode, the switching circuit is closed when the sensor is in the high current mode, and the switching circuit is open when the sensor is in the low current mode.

In general, in one aspect, the invention relates to a method for filter power to a sensor. A method for filtering power to a sensor comprises receiving an emit mode signal indicating that the sensor is in a high current mode that closes a switching circuit; shunting a filtering circuit by the closing of the switching circuit, allowing current to bypass the filtering circuit and flow through the switching circuit; receiving a receive mode signal indicating the sensor is in a low current mode that opens the switching circuit; and allowing current to flow through the filtering circuit when the switching circuit is open, wherein the switching circuit is positioned parallel to the filtering circuit.

In general, in one aspect, the invention relates to a motor vehicle. A motor vehicle comprises a sensor; and a filtering device comprising: a filtering circuit that connects a voltage source to a sensor; a switching circuit connected in parallel with the filtering circuit that allows current from the voltage source to bypass the filtering circuit and flow through the switching circuit, wherein the switching circuit receives a mode signal from the sensor that indicates whether the sensor is in a high current or a low current mode, the switching circuit is closed when the sensor is in the high current mode, and the switching circuit is open when the sensor is in the low current mode.

Other aspects and advantages of the invention will be apparent from the following description and the appended claims.

DETAILED DESCRIPTION

Figure 1:
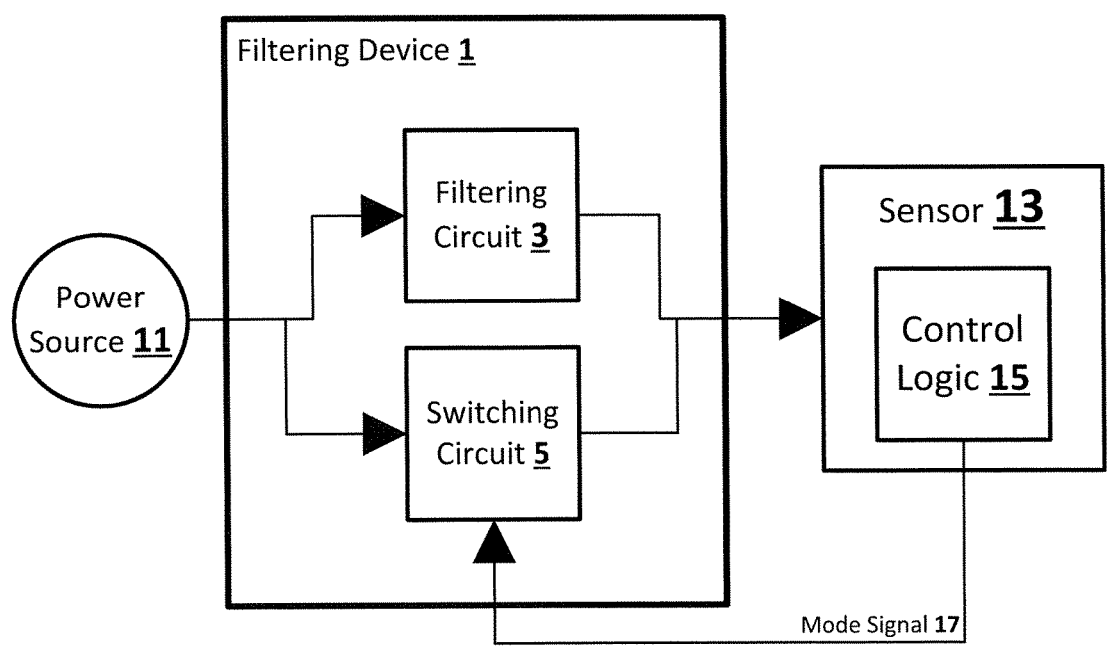
FIG. 1 shows a diagram according to one or more embodiments.

Specific embodiments will now be described in detail with reference to the accompanying figures. Like elements in the various figures are denoted by like reference numerals for consistency. Like elements may not be labeled in all figures for the sake of simplicity.

In the following detailed description, numerous specific details are set forth in order to provide a more thorough understanding of one or more embodiments of the invention. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create a particular ordering of the elements nor to limit any element to being only a single element unless expressly disclosed, such as by the use of the terms "before," "after," "single," and other such terminology. Rather, the use of ordinal numbers is to distinguish between the elements. By way of an example, a first element is distinct from a second element, and the first element may encompass more than one element and succeed (or precede) the second element in an ordering of elements.

It is to be understood that the singular forms "a," "an," and "the" include plural referents unless the context clearly dictates otherwise. Thus, for example, reference to "a horizontal beam" includes reference to one or more of such beams.

Terms like "approximately," "substantially," etc., mean that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

In general, embodiments of the invention relate to a filtering device disposed between a power source and a sensor. Sensors operating at high frequencies (e.g., approximately 50 kHz) are extremely sensitive to external noises. One such source of external noise is introduced at the power input of the sensor. Therefore, it is critical that the power supplied to the input of the sensor be filtered. This can be achieved by the addition of a resistance filtering circuit between the power supply and the power input of the sensor and a capacitor. However, certain modes of a sensor require more current consumption than others. Additionally, certain sensors require a higher input voltage (e.g., 6V) to operate. In such conditions, a filtering circuit with resistance would not be capable of passing current due to voltage drop. Embodiments herein provide a filtering device that is capable of bypassing the filtering circuit when high current consumption is required by the sensor.

FIG. 1 shows a filtering device (1) according to one or more embodiments.

As shown in FIG. 1, the filtering device (1) is electrically connected between a power source (11) and a sensor (13). The filtering device (1) is comprised of a filtering circuit (3) and a switching circuit (5). Lastly, the sensor (13) includes a control logic (15) that is capable of sending a mode signal (17) to the switching circuit (5).

In one or more embodiments, the power source (11) may be any power source, voltage source (e.g., a car battery), or power supplied through the network of the automobile.

In one or more embodiments, the sensor (13) may be an ultrasonic sensor, a motion sensor, a distance sensor, an image sensor, a laser sensor, a LIDAR sensor, a radar sensor, or any other suitable type of sensor.

In one or more embodiments, the filtering circuit (3) may include at least one resistor, at least one capacitor, at least one inductor, or any combination thereof. For example, the filtering circuit may be an RCL filter circuit.

In one or more embodiments, the filtering circuit (3) includes a resistor with a range from just a few milliohms to infinitely large (i.e., no resistor, open circuit). In one or more embodiments, the resistor may be utilized in the circuitry only when the sensor is in reception mode.

In one or more embodiments, the control logic (15) of the sensor (13) sends a mode signal (17) to the switching circuit (5) that indicates whether the sensor (13) is in a high current consumption mode ("high current mode signal (17a)") or a low current consumption mode ("low current mode signal (17b)").

In one or more embodiments, the switching circuit (5) closes upon receipt of the high current mode signal (17a). The high current mode signal transmits a current or a voltage value that meets the required threshold to close the switching circuit (5).

In one or more embodiments, the impedance (e.g., resistance) of the switching circuit (5) is lower than the impedance of the filtering circuit (3). As a result, the current from the power source (11) is directed through the switching circuit (5) when the switching circuit is closed, as this forms a path of lower impedance between the power source (11) and the sensor (13). As such, when the switching circuit (5) is closed, the current provided to the sensor (13) is not filtered through the filtering circuit (3).

In one or more embodiments, the low current mode signal transmits a current or a voltage that does not meet the required threshold to close the switching circuit (5). The switching circuit (5) opens upon receipt of the low current mode signal (17b).

In one or more embodiments, when the switching circuit (5) is open, the only path between the power source (11) and sensor (13) for current to flow is through the filtering circuit (3). As a result, when the switching circuit (5) is open, the current provided to the sensor (13) is filtered through the filtering circuit (3) to remove any extraneous noise prior to being delivered to the power input of the sensor (13).

In one or more embodiments the "high current mode" may also be referred to as an "emit mode", an "emission mode", a "transmit mode", or a "transmitting mode". Furthermore, the sensor is in a high current mode when the sensor is in emission mode. In one or more embodiments the "low current mode" may also be referred to as a "receive mode", a "reception mode", or an "evaluation mode". Furthermore, in one or more embodiments, the sensor will be in a low current mode when the sensor is in reception mode.

In one or more embodiments, the "high current" and "low current" of the "high current mode signal" and the "low current mode signal", respectively, refer to the current consumption state of the sensor (13), not the composition of the mode signal (17). That is, the mode signal (17) can be either a voltage signal or a current signal that directly indicates the current consumption state of the sensor (13).

In one or more embodiments the "high current mode signal" may also be referred to as an "emit mode signal", an "emission mode signal", a "transmit mode signal", or a "transmitting mode signal". In one or more embodiments the "low current mode signal" may also be referred to as a "receive mode signal", a "reception mode signal", or an "evaluation mode signal".

Figure 2:
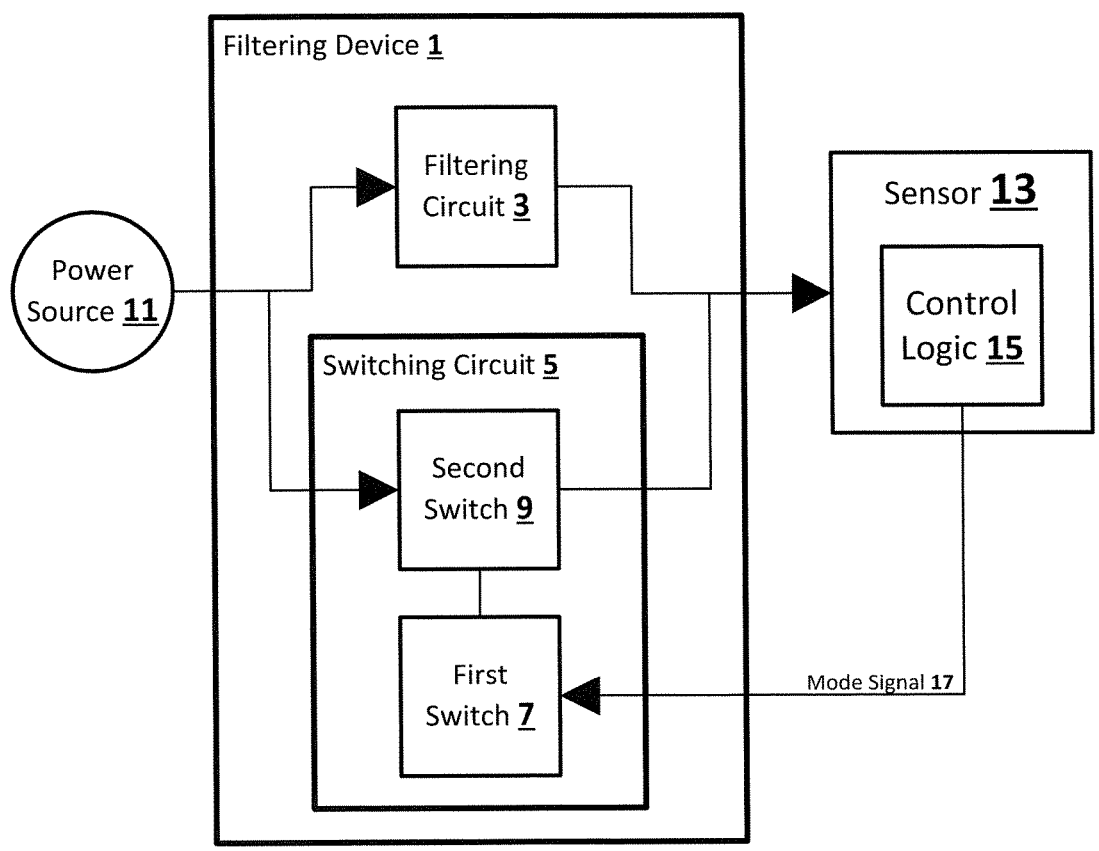
FIG. 2 shows a diagram according to one or more embodiments.

FIG. 2 shows a filtering device (1) according to one or more embodiments. The switching circuit (5) may include a first switch (7) and a second switch (9).

In one or more embodiments, the first switch (7) and the second switch (9) may be at least one of a voltage controlled switch (e.g., a metal-oxide-semiconductor field-effect transistor (MOSFET), a complementary metal-oxide-semiconductor (CMOS), etc.) or a current controlled switch (e.g., a bipolar junction transistor (BJT)), or a combination thereof.

In one or more embodiments, the first switch (7) closes upon receipt of the high current mode signal (17a). The high current mode signal transmits a current or a voltage value that meets the required threshold to close the first switch (7). The second switch (9) also closes when the first switch (7) closes.

In one or more embodiments, the impedance (e.g., resistance) of the second switch (9) is lower than the impedance of the filtering circuit (3). As a result, the current from the power source (11) is directed through the second switch (9) when the second switch (9) is closed, as this forms a path of lower impedance between the power source (11) and the sensor (13). As such, when the second switch (9) is closed, the current provided to the sensor (13) is not filtered through the filtering circuit (3).

In one or more embodiments, when the first switch (7) and the second switch (9) are closed, the switching circuit (5), as a whole, is "closed" and a new connection between the power source (11) and the sensor (13) is formed by the second switch (9). Similarly, when both the first switch (7) and second switch (9) are open, the switching circuit (5), as a whole, is "open" and the path between the switching circuit (5) becomes an open circuit between the power source (11) and the sensor (13).

In one or more embodiments, the first switch (7) and the second switch (9) close upon receipt of the high current mode signal (17a). The high current mode signal transmits a current or a voltage value that meets the required threshold to close the first switch (7) and the second switch (9).

In one or more embodiments, the impedance (e.g., resistance) of the first switch (7) and the second switch (9) is lower than the impedance of the filtering circuit (3). As a result, the current from the power source (11) is directed through the first switch (7) and the second switch (9) when the first switch (7) and the second switch (9) are closed, as this forms a path of lower impedance between the power source (11) and the sensor (13). As such, when the first switch (7) and the second switch (9) are closed, the current provided to the sensor (13) is not filtered through the filtering circuit (3).

In one or more embodiments, when the first switch (7) and the second switch (9) are closed, the switching circuit (5), as a whole, is "closed" and a new connection between the power source (11) and the sensor (13) is formed by the first switch (7) and the second switch (9). Similarly, when both the first switch (7) and second switch (9) are open, the switching circuit (5), as a whole, is "open" and the path between the switching circuit (5) becomes an open circuit between the power source (11) and the sensor (13).

Those skilled in the art will appreciate that other arrangements of the components of FIGS. 1-2 may also be envisioned within the scope of this invention, as the invention is not limited to the configuration of FIGS. 1-2.

Figure 3:
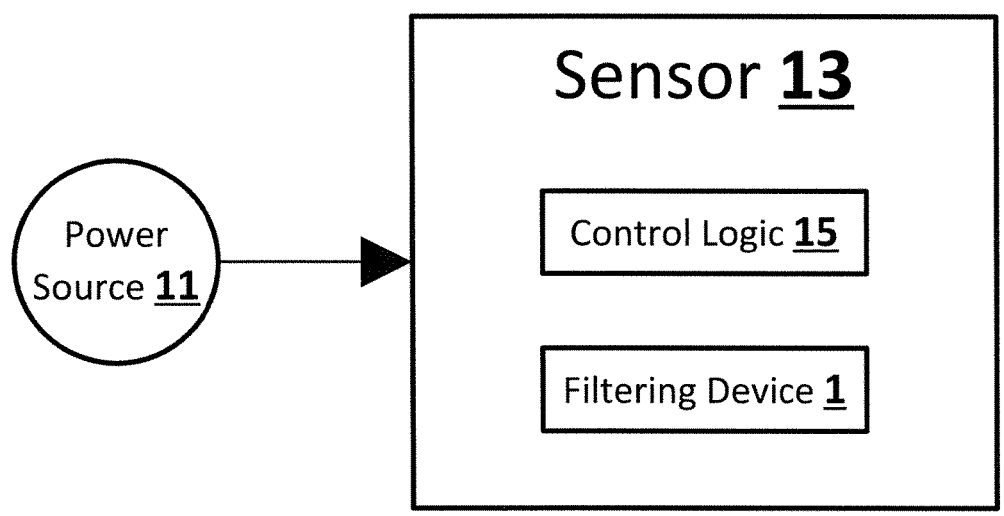
FIG. 3 shows a diagram according to one or more embodiments.

FIG. 3 shows a diagram according to one or more embodiments where the filtering device (1) is embedded within the sensor (13). In one or more embodiments, the filtering device (1) may be embedded as an integrated circuit (IC) within the sensor, rather than be outside of the sensor as shown in FIGS. 1-2. Additionally, in one or more embodiments, only certain components of the filtering device (1) may be embedded in the IC. That is, certain components may be part of the IC while other components exist outside the IC. For instance, in one or more embodiments, it would be possible to embed the switching circuit (5) into an IC while the filtering circuit (3) is not embedded in the IC. Furthermore, in one or more embodiments, one of the switches (7, 9) of the switching circuit (5) may be embedded in the IC while the other switch (7, 9) of the switching circuit (5) is not embedded in the IC.

Furthermore, the IC may be an application specific standard product (ASSP) or an application specific integrated circuit (ASIC).

Figure 4A:
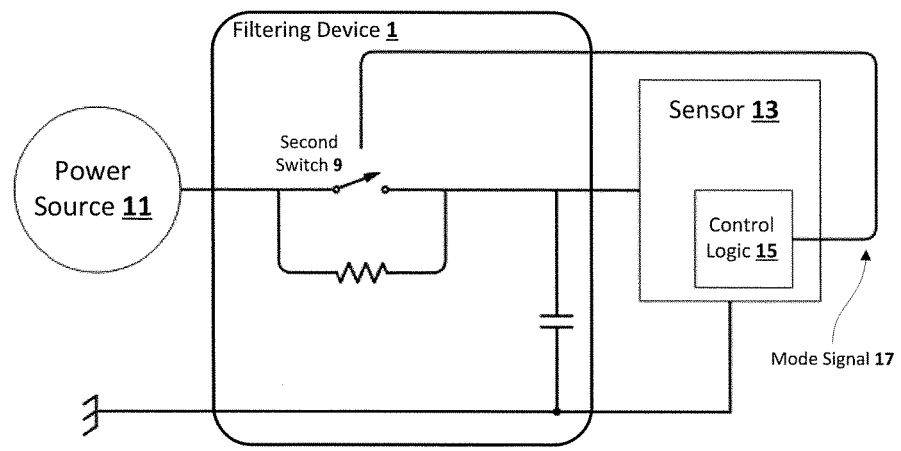
FIGS. 4A to 4C show circuit diagrams according to one or more embodiments.

FIG. 4A shows a diagram according to one or more embodiments where the filtering device contains only a single switch, second switch (9).

In one or more embodiments of the invention, a low-side switch is a switch disposed between the load and ground; and a high-side switch is a switch disposed between the power source and the load.

The second switch (9) in FIG. 4A is a high-side switch as it is disposed between the load and power source. However, one of ordinary skill in the art would appreciate that the second switch (9) could also be a low-side switch, disposed between the load and ground.

Furthermore, in one or more embodiments, the resistor need not be present. Or, equivalently, the resistor could have a resistance infinitely large to not allow for the passage of any current.

Figure 4B:
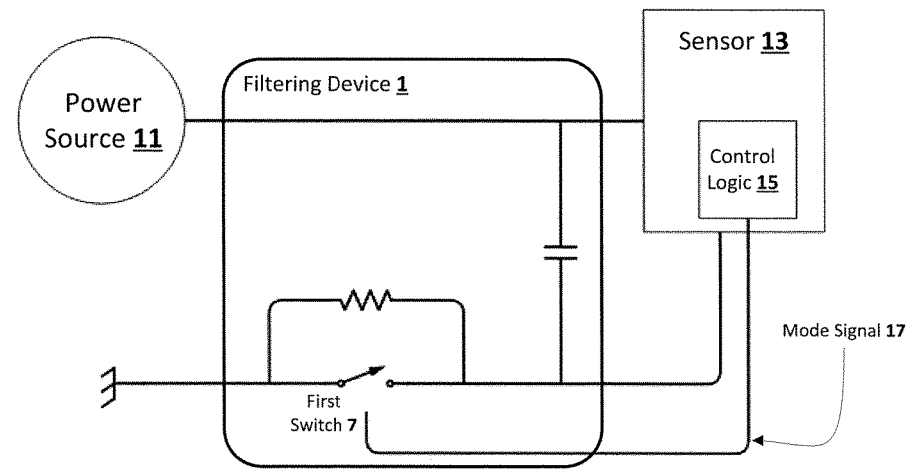

FIG. 4B shows a diagram according to one or more embodiments where the filtering device contains only a single switch, first switch (7).

The first switch (7) in FIG. 4B is a low-side switch as it is disposed between the load and ground. However, one of ordinary skill in the art would appreciate that the first switch (7) could also be a high-side switch, disposed between the load and the power source.

Furthermore, in one or more embodiments, the resistor need not be present. Or, equivalently, the resistor could have a resistance infinitely large to not allow for the passage of any current.

Figure 4C:
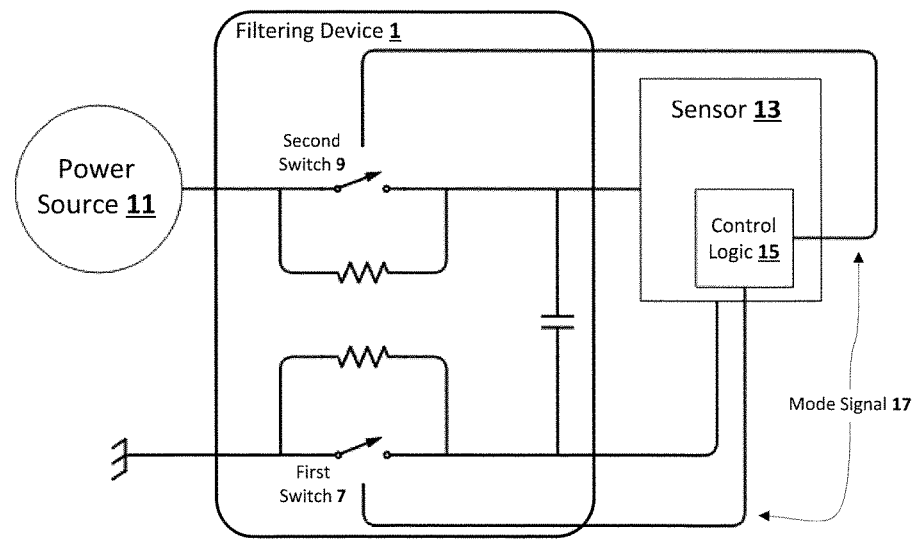

FIG. 4C shows a diagram according to one or more embodiments where the filtering device contains a first switch (7) and a second switch (9).

In one or more embodiments, the control logic (15) of the sensor (13) is connected to both the first switch (7) and second switch (9) independently.

Furthermore, in one or more embodiments, the resistors need not be present. Or, equivalently, the resistors could have a resistance infinitely large to not allow for the passage of any current.

FIGS. 5A to 5D show circuit diagrams according to one or more embodiments. Specifically, FIGS. 5A-5D show various possibilities for implementing the first and second switch (7, 9) as shown in FIGS. 1-2.

Figure 5A:
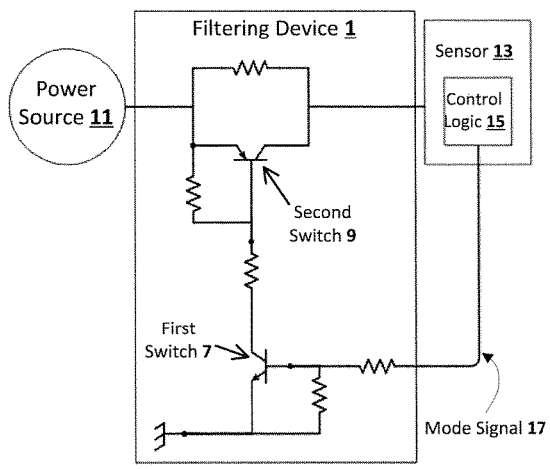
FIGS. 5A to 5D show circuit diagrams according to one or more embodiments.

For example, in one or more embodiments, FIG. 5A shows a configuration in which the filtering device (1) includes a first BJT as the first switch (7) and a second BJT as the second switch (9). The first switch (7) and the second switch (9) may be a combination of any type of BJTs (e.g. PNP, NPN, etc.). In one or more embodiments, the first and second switches (7, 9) may each be a combination of BJTs that form a Darlington pair transistor.

Figure 5B:
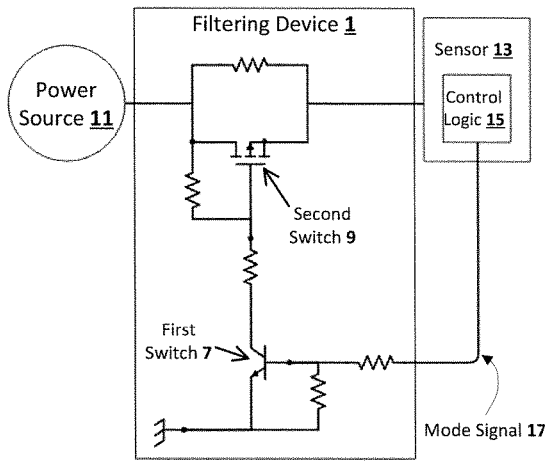
Figure 5C:
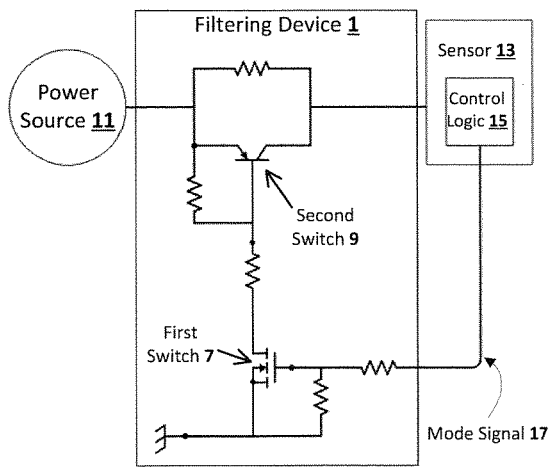
Figure 5D:
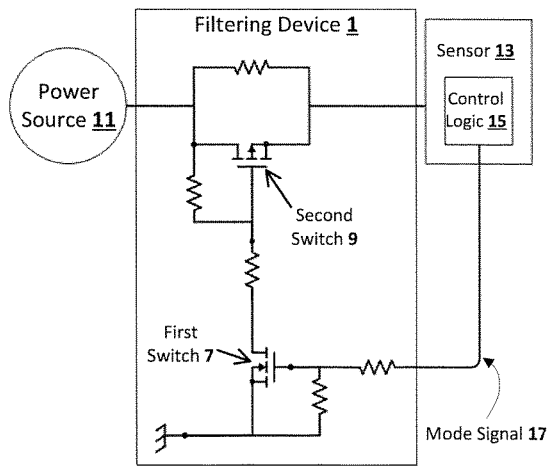

As seen in one or more embodiments shown in FIG. 5B, the filtering device (1) includes a BJT as the first switch (7) and a MOSFET as the second switch (9). The first switch (7) may be any type of BJT (e.g. PNP, NPN, etc.). The second switch (9) may be any type of MOSFET (e.g. pMOSFET, nMOSFET, CMOS, etc.).

As seen in one or more embodiments shown in FIG. SC, the filtering device (1) includes a MOSFET as the first switch (7) and a BJT as the second switch (9). The first switch (7) may be any type of MOSFET (e.g. pMOSFET, nMOSFET, CMOS, etc.). The second switch (9) may be any type of BJT (e.g. PNP, NPN, etc.).

As seen in one or more embodiments shown in FIG. SD, the filtering device (1) includes a first MOSFET as the first switch (7) and a second MOSFET as the second switch (9). The first switch (7) and the second switch (9) may be a combination of any types of MOSFETs (e.g. pMOSFET, nMOSFET, CMOS, etc.).

In one or more embodiments, the first switch (7) and the second switch (9) as shown in FIGS. 5A to 5D may each include a voltage divider circuit comprising a combination of two or more resistors. As such, it is possible to limit current and thereby properly drive the transistors.

Figure 6:
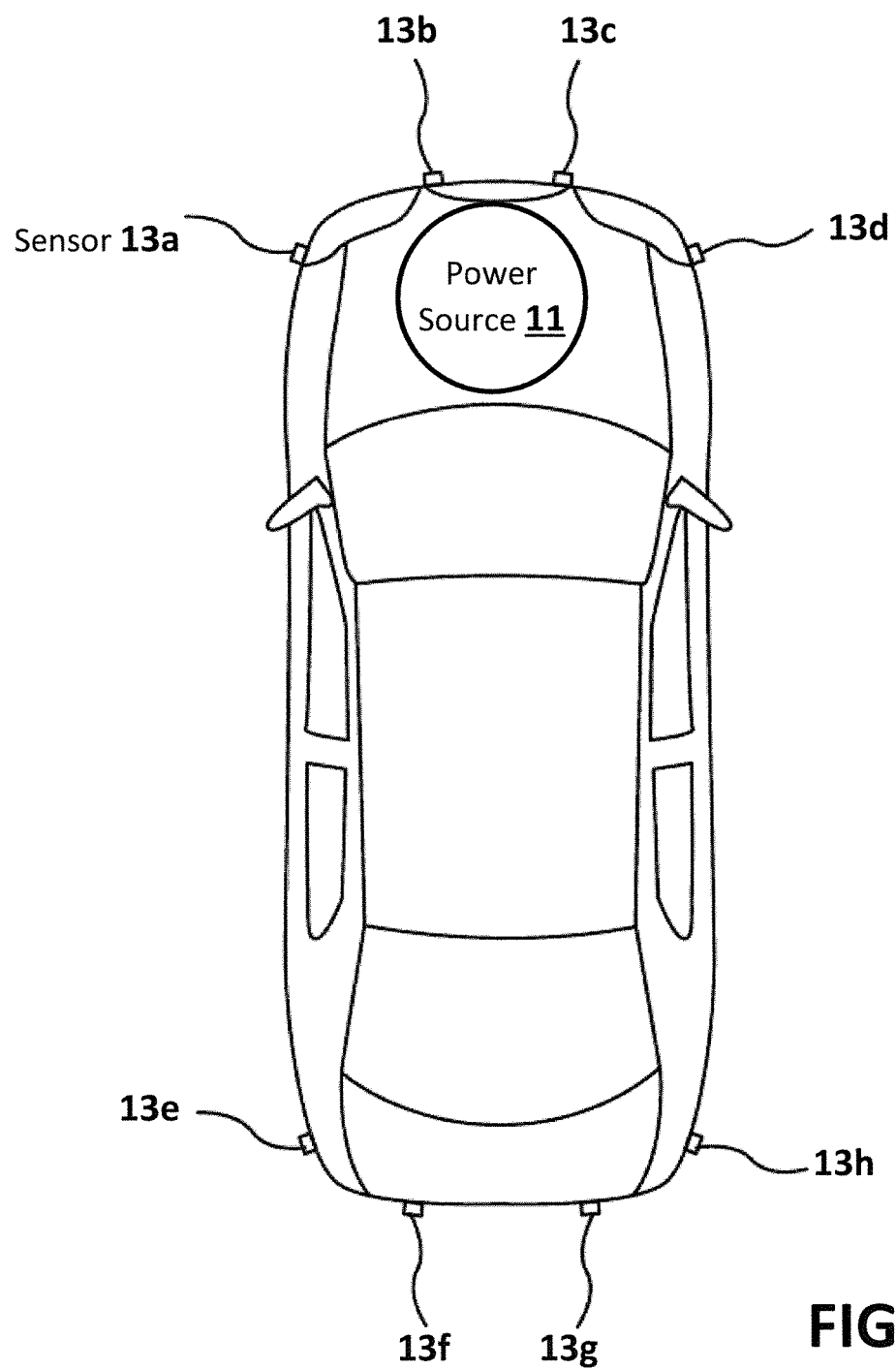
FIG. 6 shows a diagram of an automobile according to one or more embodiments.

FIG. 6 shows possible locations for one or more sensors (13) on an automobile (i.e., a motor vehicle). Each reference character 13 refers to non-limiting locations of the sensor (13) located on the vehicle. Although not explicitly shown, a sensor (13) may be placed on any suitable exterior location of the automobile.

Furthermore, FIG. 6 shows a power source (11) in one possible location. In one or more embodiments, the power source (11) may be a battery of the vehicle, in which case the location of the power source (11) may depend upon the location of the battery of the vehicle.

One of ordinary skill in the art would appreciate that the sensors of the present invention may be disposed (i.e., installed) on any device and/or object that utilizes sensors. The motor vehicle shown in the embodiment of FIG. 6 is merely a non-limiting example of one particular application of these sensors and filtering devices. By way of other examples, the sensors of the present invention may be used in supply line switches, battery charger switches, high-side switches for LEDs, drivers, and backlights, portable equipment, or any other suitable application.

Figure 7:
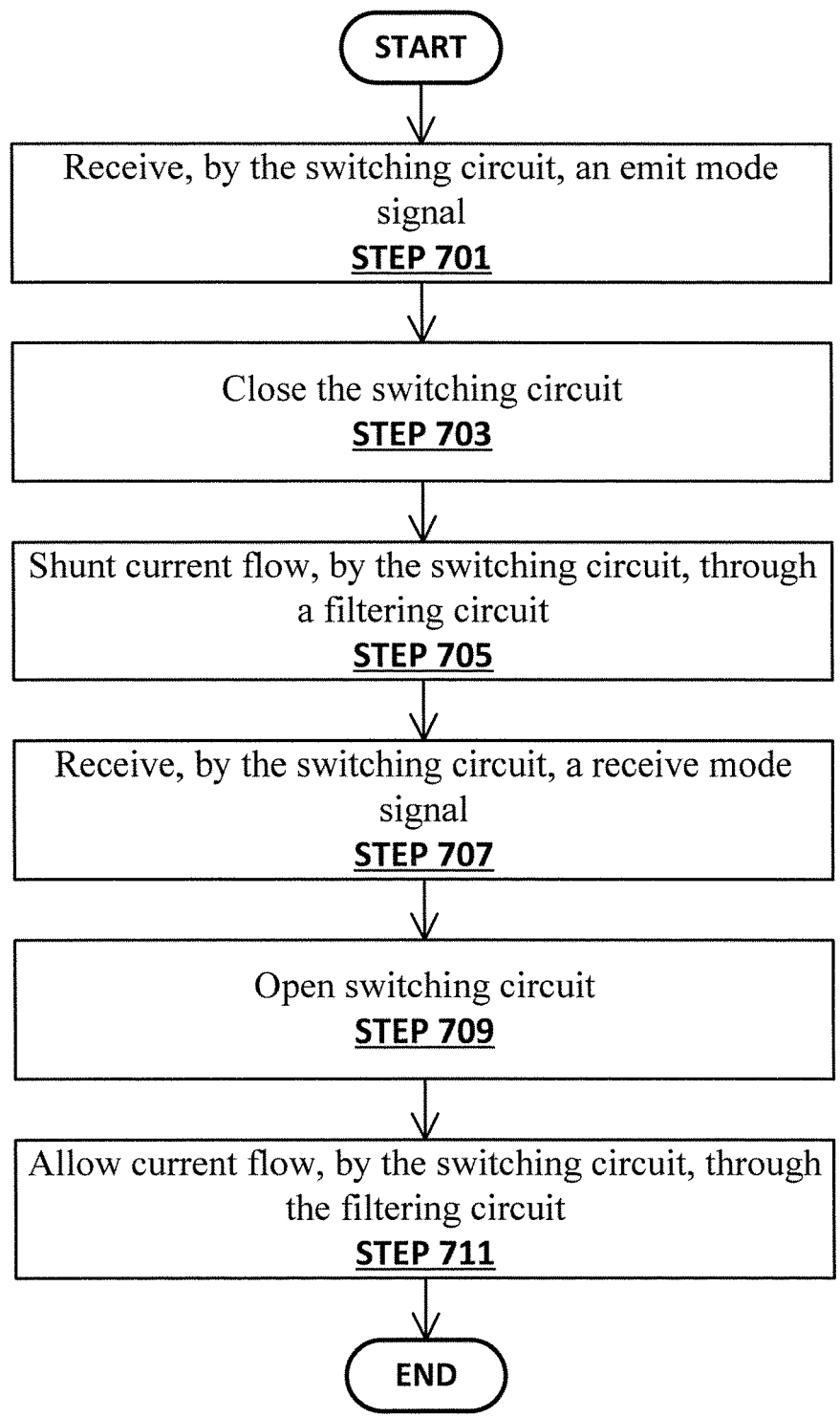
FIG. 7 shows flowchart according to one or more embodiments.

FIG. 7 shows a method of filtering sensor data according to one or more embodiments. While the various steps in FIG. 7 are presented and described sequentially, one of ordinary skill in the art will appreciate that some or all of the steps may be executed in different orders, may be combined or omitted, and some or all of the steps may be executed in parallel.

Initially, in one or more embodiments, when the sensor shifts into high current consumption state, the control logic of the sensor sends a high current mode signal to the switching circuit.

In STEP 701, the filtering device, specifically the switching circuit, receives a high current mode signal.

In STEP 703, the switching circuit closes upon receipt of the high current mode signal from the sensor. Once the switching circuit is closed, a path parallel to the filtering circuit exists between the power source and the sensor.

In STEP 705, the current flowing from the power source to the sensor bypasses the filtering circuit and flows through the switching circuit. This is a result of the path through the switching circuit having a lower impedance than the impedance of the filtering circuit. The current will flow from the power source to the sensor unfiltered.

In STEP 707, the filtering device, specifically the switching circuit, receives a low current mode signal. In one or more embodiments, the low current mode signal is sent from the sensor to the switching circuit when the sensor shifts into a low current mode.

In STEP 709, the switching circuit is toggled to open upon receipt of the low current mode signal from the control logic. The switching circuit now becomes an open circuit.

In STEP 711, as a result of the switching circuit being toggled open, the current flowing from the power source to the sensor flows exclusively through the filtering circuit. The current that flows from the power source to the sensor is filtered through the filtering circuit to remove external noises.

Figure 8:
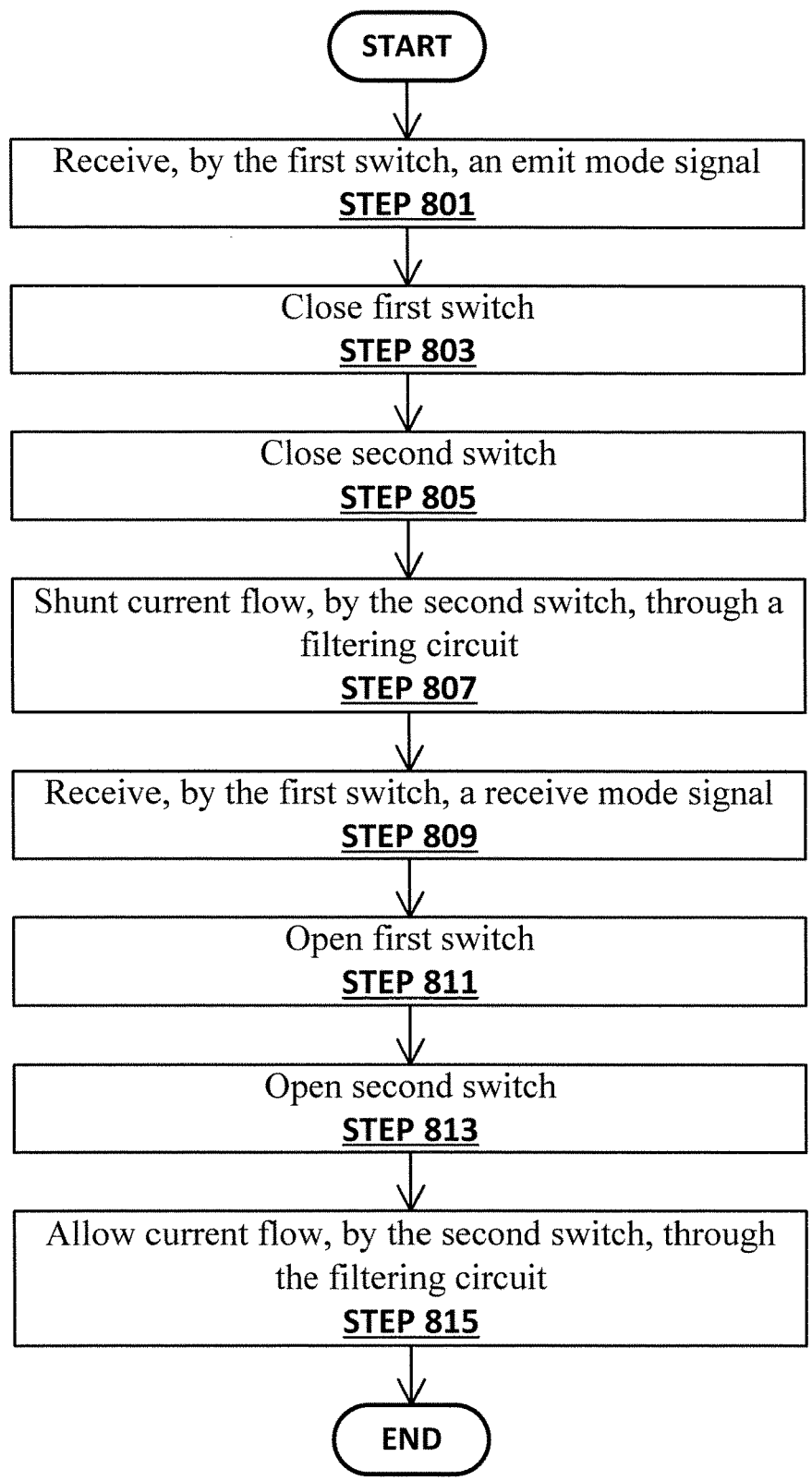
FIG. 8 shows flowchart according to one or more embodiments.

FIG. 8 shows a method of filtering sensor data according to one or more embodiments. While the various steps in FIG. 8 are presented and described sequentially, one of ordinary skill in the art will appreciate that some or all of the steps may be executed in different orders, may be combined or omitted, and some or all of the steps may be executed in parallel.

Initially, in one or more embodiments, when the sensor shifts into high current consumption state, the control logic of the sensor sends a high current mode signal to the first switch of the switching circuit.

In STEP 801, the filtering device, specifically the first switch of the switching circuit, receives a high current mode signal.

In STEP 803, the first switch closes upon receipt of the high current mode signal from the sensor. The first switch then sends a signal (i.e., a current or a voltage) to toggle the second switch.

In STEP 805, the second switch closes upon receipt of the signal from the first switch. Once the second switch is closed, a path parallel to the filtering circuit exists between the power source and the sensor.

In STEP 807, the current flowing from the power source to the sensor bypasses the filtering circuit and flows through the second switch. This is a result of the path through the second switch having a lower impedance than the impedance of the filtering circuit. The current will flow from the power source to the sensor unfiltered.

In STEP 809, the filtering device, specifically the first switch of the switching circuit, receives a low current mode signal. In one or more embodiments, the low current mode signal is sent from the sensor to the first switch when the sensor shifts into a low current mode.

In STEP 811, the first switch is toggled to open upon receipt of the low current mode signal from the control logic. The first switch now becomes an open circuit in the switching circuit.

In STEP 813, the second switch is toggled to an open state as a result of the first switch opening. This is a direct result of no signal being transmitted from the first switch to the second switch once the first switch has become an open circuit. Once the second switch is open, the path parallel to the filtering circuit created in STEP 807 no longer exists between the power source and the sensor.

In STEP 815, as a result of the second switch being toggled open, the current flowing from the power source to the sensor flows exclusively through the filtering circuit. The current that flows from the power source to the sensor is filtered through the filtering circuit to remove external noises.

Figure 9:
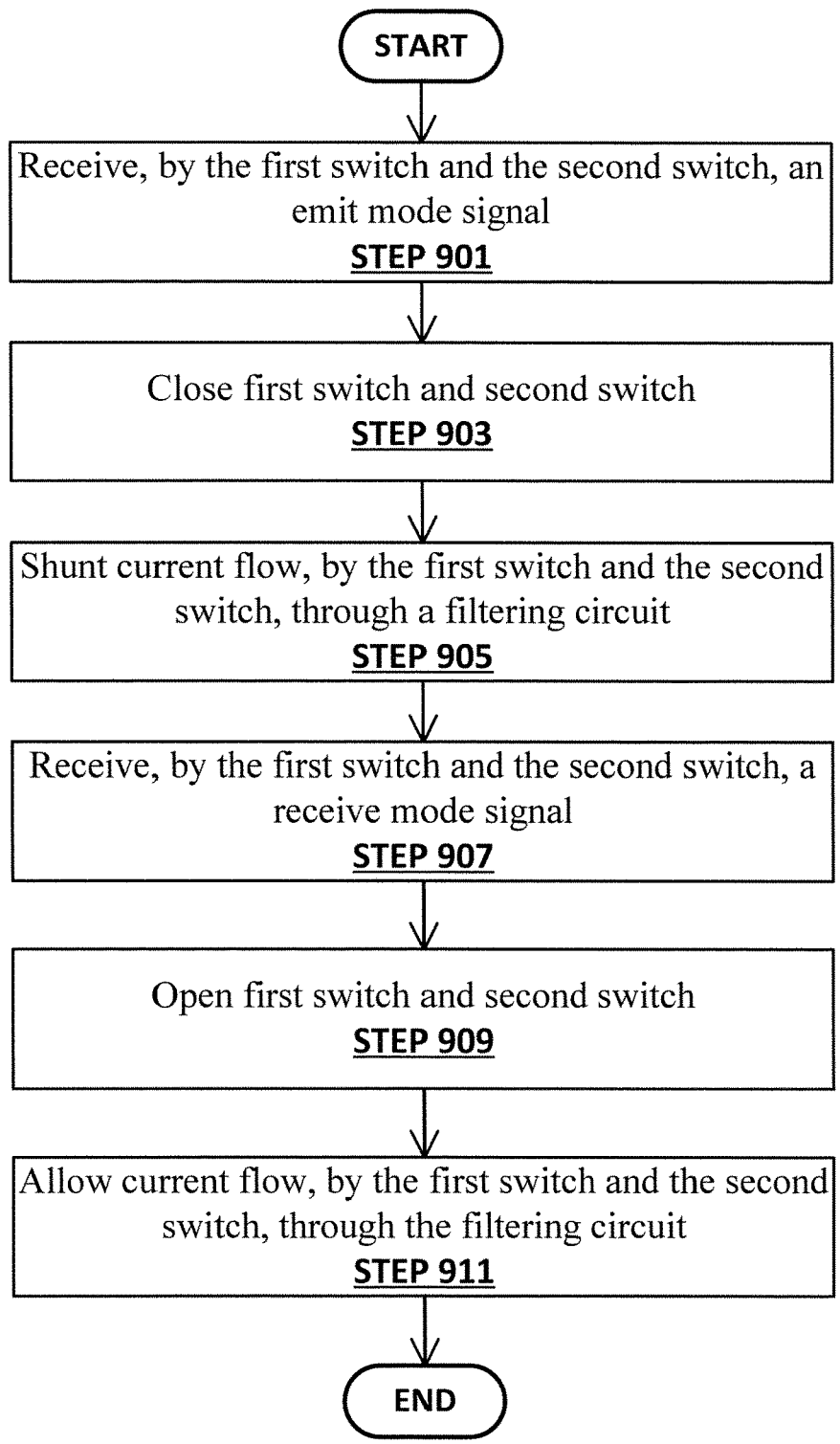
FIG. 9 shows flowchart according to one or more embodiments.

FIG. 9 shows a method of filtering sensor data according to one or more embodiments. While the various steps in FIG. 9 are presented and described sequentially, one of ordinary skill in the art will appreciate that some or all of the steps may be executed in different orders, may be combined or omitted, and some or all of the steps may be executed in parallel.

Initially, in one or more embodiments, when the sensor shifts into high current consumption state, the control logic of the sensor sends a high current mode signal to the first switch and the second switch of the switching circuit.

In STEP 901, the filtering device, specifically the first switch and second switch, receives a high current mode signal.

In STEP 903, the first switch and second switch close upon receipt of the high current mode signal from the sensor. Once the first switch and second switch are closed, paths parallel to the filtering circuit exist between the power source and the sensor.

In STEP 905, the current flowing from the power source to the sensor bypasses the filtering circuit and flows through the first switch and second switch. This is a result of the path through the first switch and second switch having a lower impedance than the impedance of the filtering circuit. The current will flow from the power source to the sensor unfiltered.

In STEP 907, the filtering device, specifically the first switch and second switch, receives a low current mode signal. In one or more embodiments, the low current mode signal is sent from the sensor to the first switch and second switch when the sensor shifts into a low current mode.

In STEP 909, the first switch and second switch is toggled to open upon receipt of the low current mode signal from the control logic. The first switch and second switch now become an open circuit.

In STEP 911, as a result of the first switch and second switch being toggled open, the current flowing from the power source to the sensor flows exclusively through the filtering circuit. The current that flows from the power source to the sensor is filtered through the filtering circuit to remove external noises.

Embodiments of the invention provide a resistor for filtering noise from the power supply for sensitive sensors, such as ultrasonic and high-power sensors. The resistor is only passed through in reception mode, when the current consumption is low (e.g., ~20 mA). In the emission mode, the resistor is shunted, and this is achieved by the transistor switches as described above, placed in parallel to the resistor.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

What is claimed is:

1. A filtering device comprising:
   a filtering circuit that connects a voltage source to a sensor;
   a switching circuit connected in parallel with the filtering circuit that allows current from the voltage source to bypass the filtering circuit and flow through the switching circuit, wherein
   the switching circuit receives a mode signal from the sensor that indicates whether the sensor is in a high current or a low current mode,
   the switching circuit is closed when the sensor is in the high current mode, and
   the switching circuit is open when the sensor is in the low current mode.

2. The filtering device according to claim 1, wherein:
   the switching circuit comprises a first switch and a second switch.

3. The filtering device according to claim 2, wherein:
   the first switch receives the mode signal from the sensor,
   the second switch is operated by the first switch and connected in parallel with the filtering circuit,
   the second switch is closed when the sensor is in the high current mode,
   the second switch is open when the sensor is in the low current mode, and
   the current bypasses the filtering circuit when the second switch is closed.

4. The filtering device according to claim 2, wherein:
   the first switch and the second switch each receive the mode signal independently from the sensor,
   the first switch and the second switch are closed when the sensor is in the high current mode,
   the first switch and the second switch are open when the sensor is in the low current mode,
   the current bypasses the filtering circuit when the first switch and the second switch are closed,
   the first switch is a low-side switch, and
   the second switch is a high-side switch.

5. The filtering device according to claim 2, wherein:
   the first switch is a first bipolar junction transistor (BJT); and
   the second switch is a second BJT.

6. The filtering device according to claim 2, wherein:
   the first switch is a BJT; and
   the second switch is a metal-oxide-semiconductor field-effect transistor (MOSFET).

7. The filtering device according to claim 2, wherein:
   the first switch is a MOSFET; and
   the second switch is a BJT.

8. The filtering device according to claim 2, wherein:
   the first switch is a first MOSFET; and
   the second switch is a second MOSFET.

9. The filtering device according to claim 1, wherein:
   the filtering device is an integrated circuit (IC); and
   the sensor is an ultrasonic sensor.

10. The filtering device according to claim 9, wherein:
    the integrated circuit (IC) is embedded in the ultrasonic sensor, and
    the IC comprises at least one of the filtering circuit, the first switch, and the second switch.

11. A method for filtering power to a sensor comprising:
    receiving an emit mode signal indicating that the sensor is in a high current mode that closes a switching circuit;
    shunting a filtering circuit by the closing of the switching circuit, allowing current to bypass the filtering circuit and flow through the switching circuit;
    receiving a receive mode signal indicating the sensor is in a low current mode that opens the switching circuit; and
    allowing current to flow through the filtering circuit when the switching circuit is open, wherein
    the switching circuit is positioned parallel to the filtering circuit.

12. The method for filtering power to the sensor according to claim 11, wherein:
    the switching circuit comprises a first switch and a second switch.

13. The method for filtering power to the sensor according to claim 12, wherein:
    the emit mode signal indicating that sensor is in the high current mode closes the first switch,
    the receive mode signal indicating that sensor is in the low current mode opens the first switch, and
    the method further comprising:
       closing the second switch in response to the first switch closing; and
       opening the second switch in response to the first switch opening, wherein
       the current bypasses the filtering circuit when the second switch is closed.

14. The method for filtering power to the sensor according to claim 12, wherein:
    the first switch and the second switch each receive the mode signal independently from the sensor,
    the emit mode signal indicating that sensor is in the high current mode closes the first switch and the second switch,
    the receive mode signal indicating that the sensor is in the low current mode opens the first switch and the second switch,
    the current bypasses the filtering circuit when the first switch and the second switch are closed,
    the first switch is a low-side switch, and
    the second switch is a high-side switch.

15. The method for filtering power to the sensor according to claim 11, wherein:
    the filtering device is an integrated circuit (IC); and
    the sensor is an ultrasonic sensor.

16. The method for filtering power to the sensor according to claim 15, wherein:

the integrated circuit (IC) is embedded in the ultrasonic sensor, and the IC comprises at least one of the filtering circuit, the first switch, and the second switch.

17. A motor vehicle comprising:
a sensor; and
a filtering device comprising:
   a filtering circuit that connects a voltage source to a sensor;
   a switching circuit connected in parallel with the filtering circuit that allows current from the voltage source to bypass the filtering circuit and flow through the switching circuit, wherein
   the switching circuit receives a mode signal from the sensor that indicates whether the sensor is in a high current or a low current mode,
   the switching circuit is closed when the sensor is in the high current mode, and
   the switching circuit is open when the sensor is in the low current mode.

18. The motor vehicle according to claim 17, wherein:
the switching circuit comprises a first switch and a second switch.

19. The motor vehicle according to claim 18, wherein:
the first switch receives the mode signal from the sensor,
the second switch is operated by the first switch and connected in parallel with the filtering circuit,
the second switch is closed when the sensor is in the high current mode,
the second switch is open when the sensor is in the low current mode, and
the current bypasses the filtering circuit when the second switch is closed.

20. The motor vehicle according to claim 18, wherein:
the first switch and the second switch each receive the mode signal independently from the sensor,
the first switch and the second switch are closed when the sensor is in the high current mode,
the first switch and the second switch are open when the sensor is in the low current mode,
the current bypasses the filtering circuit when the first switch and the second switch are closed,
the first switch is a low-side switch, and
the second switch is a high-side switch.

\* \* \* \* \*